(12) United States Patent
Frium

(10) Patent No.: US 9,077,257 B2
(45) Date of Patent: Jul. 7, 2015

(54) POWER SUPPLY ARRANGEMENT FOR SINGLE ENDED CLASS D AMPLIFIER

(75) Inventor: Mads Peter Frium, Allerod (DK)

(73) Assignee: BANG & OLUFSEN ICEPOWER A/S, Lyngby (DK)

( * ) Notice: Subject to any disclaimer, the term of this patent is extended or adjusted under 35 U.S.C. 154(b) by 28 days.

(21) Appl. No.: 14/115,372

(22) PCT Filed: May 21, 2012

(86) PCT No.: PCT/EP2012/059363
§ 371 (c)(1),
(2), (4) Date: Nov. 4, 2013

(87) PCT Pub. No.: WO2012/160021
PCT Pub. Date: Nov. 29, 2012

(65) Prior Publication Data
US 2014/0070885 A1    Mar. 13, 2014

(30) Foreign Application Priority Data

May 25, 2011  (DK) .................................. 2011 00397
Jul. 5, 2011   (EP) ...................................... 11172638

(51) Int. Cl.
*H03F 3/04*      (2006.01)
*H02M 3/335*     (2006.01)
*H03F 3/217*     (2006.01)
*H03F 3/185*     (2006.01)
*H02M 1/00*      (2007.01)

(52) U.S. Cl.
CPC .. *H02M 3/33569* (2013.01); *H02M 2001/0006* (2013.01); *H03F 3/217* (2013.01); *H03F 3/185* (2013.01); *H03F 3/2171* (2013.01)

(58) Field of Classification Search
USPC .............................. 330/297, 127, 251, 207 A
IPC .......................................................... H03F 3/04
See application file for complete search history.

(56) References Cited

U.S. PATENT DOCUMENTS 6,300,829 B1 * 10/2001 Luu .............................. 330/251
(Continued)

FOREIGN PATENT DOCUMENTS

WO   WO 2007/096761    8/2007
WO   WO 2010/022220    2/2010

OTHER PUBLICATIONS

International Search Report from PCT/EP2012/059363 (now WO 2012/1600021); dated Oct. 24, 2012; The instant application is a national phase of PCT/EP2012/059363; 2 pages.

*Primary Examiner* — Patricia T Nguyen
(74) *Attorney, Agent, or Firm* — Harness, Dickey & Pierce, P.L.C.

(57) ABSTRACT

A power supply arrangement for a single ended class D amplifier, including a first primary winding connected in series with a first switch between the positive supply rail and ground, a second primary winding in phase with said first primary winding and connected in series with a second switch between the negative supply rail and ground, and a controller adapted to apply a control signal to said first and second switches, said control signal (Q) having ON-pulses of a predefined pulse time separated by a dead time. In use, the primary winding connected to the supply rail with the highest numerical voltage will transform the rail voltage difference to the supply rail with the lowest numerical voltage through the opposite primary winding thus reducing any voltage unbalance between the windings.

12 Claims, 3 Drawing Sheets

(56) References Cited

U.S. PATENT DOCUMENTS

| | | | |
|---|---|---|---|
| 6,639,815 B1 * | 10/2003 | Gucyski | 363/40 |
| 2007/0076446 A1 * | 4/2007 | Shiga et al. | 363/17 |
| 2008/0278985 A1 * | 11/2008 | Ribarich | 363/127 |
| 2008/0297248 A1 * | 12/2008 | Honda | 330/251 |
| 2009/0102295 A1 | 4/2009 | Petersen | |
| 2009/0289710 A1 * | 11/2009 | Hardy et al. | 330/251 |

* cited by examiner

POWER SUPPLY ARRANGEMENT FOR SINGLE ENDED CLASS D AMPLIFIER

CROSS REFERENCE TO RELATED APPLICATIONS

This patent application is a U.S. national stage filing under 35 U.S.C. §371 of International Application No. PCT/EP2012/059363 filed May 21, 2012 (published as WO 2012/160021 on Nov. 29, 2012), which claims priority of Denmark application No. PA201100397 filed May 25, 2011, which claims priority of European application No. 11172638.6 filed Jul. 5, 2011 (published as EP2533408). The disclosures of the applications identified in this paragraph are incorporated herein by reference in their entirety.

TECHNICAL FIELD

This invention relates to DC-DC and DC-AC conversion for Audio where the inverter stage (DC-AC) is a Single-Ended class-D amplifier.

TECHNICAL BACKGROUND

The two predominant topologies, known in prior art, and used for class-D amplifiers are the full-bridge- and the half-bridge topology.

For low cost consumer products the half-bridge topology has a distinct advantage over the full-bridge since only half the number of power switches, drivers and output inductors is needed. Even though the voltage rating of the power switches is doubled in the half-bridge topology, there is still a manufacturing and cost benefit of the reduction. Since the speaker output terminals are referenced to ground, overload protection and output sensing becomes easier compared to the full-bridge topology.

The drawback of the half-bridge class-D topology is the need for a dual rail supply and the fact that this topology will pump current back to the opposite supply rail from where the power is being drained.

Document WO 2010/022220 discloses one approach to supply pump cancelling. According to this solution, a logic module detects where the highest voltage is, and drives one of two switches to transfer energy.

In an earlier application from the applicant (US 2009/0102295) an efficient solution to the rail pumping problem has been disclosed. By that invention the advantages using a single-ended class D-amplifier in consumer products has been obtained.

SUMMARY OF THE INVENTION

More particularly, an embodiment of the invention relates to power supply arrangement comprising power supply unit with a positive supply rail and a negative supply rail for supplying a single ended class D amplifier, and a transformer arrangement connected between the positive and negative power rails. The transformer arrangement includes a first primary winding connected in series with a first switch between the positive supply rail and ground, a second primary winding in phase with the first primary winding and connected in series with a second switch between the negative supply rail and ground, and a controller adapted to apply a control signal to the first and second switches, the control signal (Q) having ON-pulses of a predefined pulse time (pt) separated by a dead time. When the first and second switches are closed (ON), the first winding will experience a first potential difference and the second winding will experience a second potential difference. If the first potential difference is greater than the second potential difference, the second switch will act as a rectifier, and energy will be transformed from the first winding to the second winding, and if the second potential difference is greater than the first potential difference, the first switch will act as a rectifier, and energy will be transformed from the second winding to the first winding.

During the forward cycle, when both switches are closed (ON), the primary winding connected to the supply rail with the highest numerical voltage will transform the rail voltage difference to the supply rail with the lowest numerical voltage through the opposite primary winding thus reducing any unbalance between the windings. This action is referred to as supply pump cancellation. The action of pump reduction will occur continuously cycle by cycle. (By "highest numerical voltage" is intended the rail having a voltage further away from zero. A negative voltage of −31 is thus "numerically greater" than a positive voltage of +29.)

By actively eliminating or reducing the supply pumping the need for large rail capacitors can be avoided thus improving system compactness and supply quality which inherently will lead to better audio performance. The invention enables all the benefits of the single-ended amplifier structure without introducing the classical problems that arises with the supply rail pumping phenomena.

Due to the pump cancelling action of the described powersupply any front-end +/− power supply rail, originated from either a switch mode or linear power supply will work since the power supply only needs to source current.

According to a preferred embodiment, the power supply arrangement further includes a pump current control arrangement, including a transformer having a pump current control primary winding connected in series with the first primary winding, a pump current control secondary winding for monitoring a magnitude of a pump current through the pump current control primary winding, and a feedback path for feeding pump current information from the secondary winding back to an audio signal control path of a single ended class D amplifier connected to the power supply arrangement in order to enable pump current regulation.

The transformer arrangement further comprises an air-gap and at least one secondary winding, 180 degrees phase shifted from the first and second primary windings, for supplying at least one secondary voltage.

In this case the power supply arrangement is adapted to store energy in the transformer air gap during the forward cycle, and the stored energy can be distributed to the secondary windings to provide flyback voltages during the second cycle (flyback cycle). The secondary voltages may be used for various "house-keeping" purposes, such as power supply for operational amplifiers and driving field effect transistors in an audio amplifier.

This embodiment provides a flyback converter with pump cancelling functionality in a very simple and cost efficient manner. The primary winding subject to the greater potential difference will form part of a flyback converter, and convert power to the secondary windings, while the other primary winding reflects the voltage across the power converting primary during the forward cycle, to achieve pump cancelling thus assuring rail-voltage balancing.

The power supply arrangement according to this embodiment essentially includes a fly-back converter which has been provided with an additional primary winding enabling it to provide pump cancelling of a single ended class D amplifier connected to the positive and negative supply rails.

Any of the two primary windings can be used for power conversion; the opposite primary will reflect the voltage across the converting primary with reversed polarity during the forward cycle.

The secondary voltage(s) may advantageously be regulated by current mode pulse width modulation of the control signal that is provided to the switches in the transformer arrangement.

According to one embodiment, the power supply arrangement is provided with a flyback control arrangement for monitoring the magnitude of the flyback current, including a flyback current transformer having a first flyback control primary winding connected in series with said first primary winding, a second flyback control primary winding connected in series with said second primary winding and in phase with said first flyback control primary winding, and a flyback control secondary winding coupled in phase with said first and second flyback control primary windings, for monitoring a magnitude of a flyback current through the flyback control primary winding, and a feedback path for feeding flyback current information from said flyback control secondary winding back to said controller for regulating any flyback secondary voltages by current mode pulse width modulation of the control signal (Q).

Current information of the pump cancel cycle and the flyback cycle can be monitored separately, by implementing both a pump current control transformer and a flyback control transformer separately from each other.

Cycle by cycle current limiting can thus be obtained for both supply pump regulation and secondary flyback regulation. The current limit levels may be set separately for the two modes.

An arrangement according to the present invention is advantageously embedded into consumer or professional multimedia products including audio/video providers.

A power supply arrangement according to the present invention may be implemented in any consumer or professional product including means to provide audio to a user; this being, but not limited to: audio/video systems, multimedia players, audio/video appliances in automobiles, in boats and alike.

BRIEF DESCRIPTION OF THE DRAWINGS

The present invention will be described in more detail with reference to the appended drawings, showing currently preferred embodiments of the invention.

DETAILED DESCRIPTION OF PREFERRED EMBODIMENTS

Figure 1:
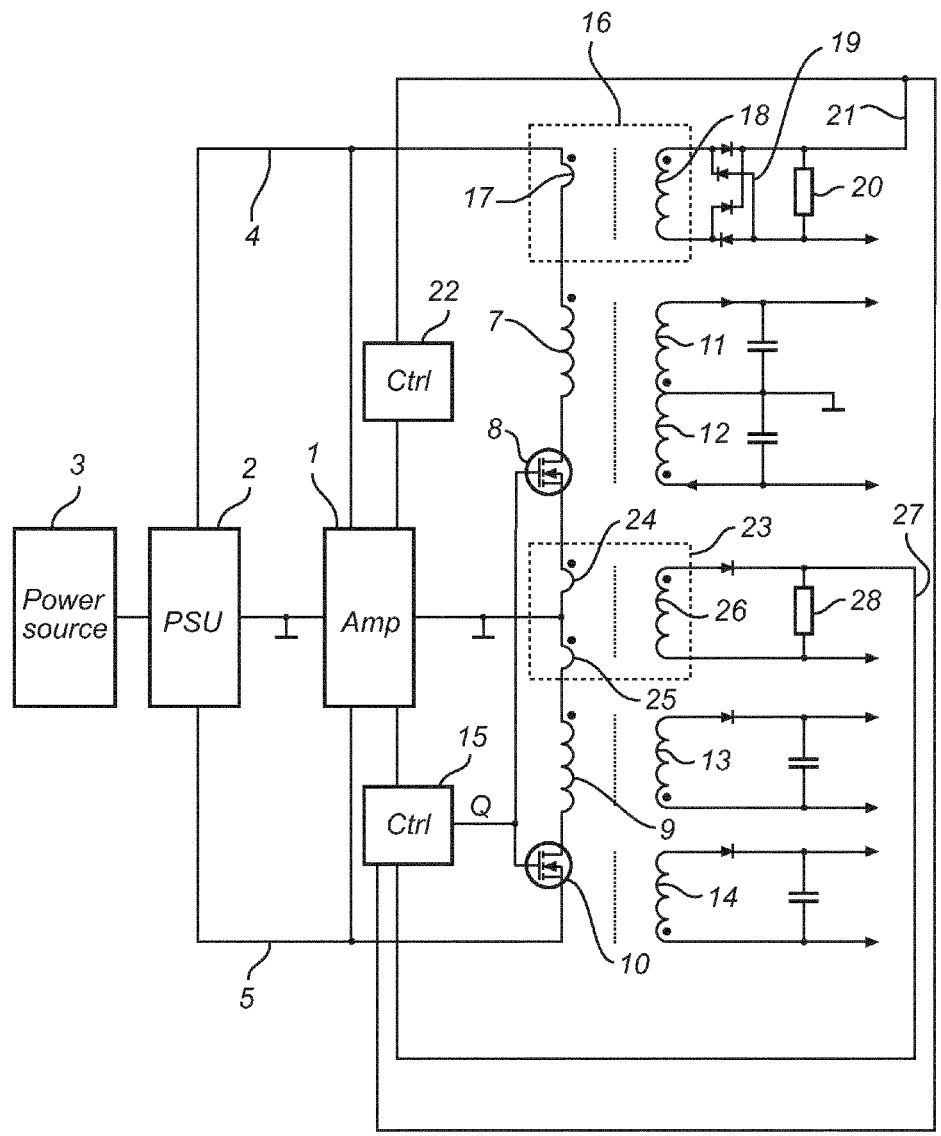
FIG. 1 shows a block schematic of an audio amplifier system implementing a power supply arrangement according to an embodiment of the present invention.

FIG. 1 illustrates an audio system comprising a single ended class D amplifier 1 connected to a power supply unit (PSU) 2 fed by a power source 3. The power source 3 may be AC or DC, and the power supply unit may be of switch mode type or a simple linear PSU. The PSU 2 has two supply rail outputs, a positive rail 4 and a negative rail 5, which are connected to and provide power to the single ended class D amplifier 1.

The system further comprises a transformer arrangement, connected between the rails 4, 5. The transformer arrangement comprises a first primary winding 7 connected in series with a first switch 8 between the positive rail 4 and ground, and a second primary winding 9, connected in series with a second switch 10 between the negative rail and ground. The number of turns in each primary winding is preferably the same. Each switch 8 and 10 should preferably have the same electrical characteristics hence having the same voltage drop regardless of current flow and temperature hence assuring best possible tracking between rails. The switches 8, 10 may be for example MOSFET transistors.

The transformer arrangement further comprises one or several, in the illustrated case four, secondary windings 11, 12, 13, 14, 180 degrees phase shifted from the primary windings. These windings form an auxiliary power supply for supplying a number of housekeeping voltages for class-D amplifier operation. In particular, the windings 11 and 12 provide positive and negative drive voltages (typically plus and minus 5 V) for signal amplifiers (e.g. operational amplifiers) in the class D amplifier 1. The winding 13 provides a single voltage output intended to supply low side class-D amplifier FET-drivers. This voltage can be bootstrapped to provide a high side voltage for the FET drivers. The winding 14 provides an auxiliary flyback voltage. Any additional application specific flyback output voltages could be added.

The switches 8 and 10 are controlled by a control signal Q from a controller 15, here a current mode controller. The control signal can be a square pulse signal, including ON-pulses separated by dead-time.

The transformer arrangement can be implemented in a single magnetic structure. According to one embodiment, the transformer arrangement is a planar transformer where the windings 7, 9, 11, 12, 13, 14 are formed on a printed circuit board (PCB).

The system in FIG. 1 further comprises a pump current control 16, comprising a primary winding 17 connected between the first primary winding 7 and the positive rail 4, and a secondary winding 18 for detecting the magnitude of the bidirectional current through the primary winding 17. The pump current control 16 further comprises a feedback path 21 with a full bridge rectifier 19 and a resistor 20, which is adapted to feed a voltage across the resistor 20 back to an amplifier controller 22 connected to the single ended class D amplifier 1. The feedback path is here also connected to the current mode controller 15.

The system further comprises a flyback control 23 having a first primary winding 24 connected in series with the first primary winding 7 and a second primary winding 25 connected in series with the second primary winding 9. The primary windings 24 and 25 are in phase. The flyback control 23 further comprises a secondary winding 26 coupled in phase with the primary windings 24, 25, for monitoring the magnitude of the current through the primary windings 24 and 25. The flyback control further comprises a feedback path 27 feeding the voltage across a resistor 28 back to the current mode controller 15.

The primary windings 24, 25 are arranged in such a manner that the the pump currents through windings 24 and 25 cancel each other, ensuring that only the flyback current will be detected by the winding 26 and supplied to the current mode controller 15.

During operation, the amplifier 1 is power supplied by the positive and negative rails 4, 5. The switches 8, 10 are controlled by the controller 15, to switch between a forward cycle, during which both switches 8, 10 are closed, and a flyback cycle, during which both switches are open.

In the forward cycle, the positive supply rail voltage will be present across winding 7, and the negative supply rail voltage will be present across the winding 9. The potential differences across the windings 7 and 9 will have the same polarity (i.e. the dot connected to the positive side in both cases). The rail with the highest voltage will be transformed in the forward cycle to the opposite rail. Switch 8 and switch 10 will either act as a switch or a rectifier depending on the direction of the current flow.

As a consequence, the potential difference will even out, and the pumping effect will be limited or eliminated.

This is referred to as a supply pump reduction system, which redistributes any pumping charge being fed back from the single ended class D-amplifier by forcing current flow from the rail with the highest numerical voltage to the rail with the lowest numerical voltage. The pump reduction action occurs continuously cycle by cycle.

At the same time as transferring energy to the rail with lower numerical potential, the primary winding subject to the greatest potential difference will also charge the air gap of the transformer arrangement.

During the flyback cycle, when the switches 8, 10 are open, the energy stored in the air gap during the forward cycle will be redistributed through the secondary windings and rectifier diodes resulting in secondary flyback voltages. The transformer arrangement is thus active in converting power in both the forward and the flyback cycle.

Information about the pump current is fed back to the amplifier controller 22, and to the current mode controller 15, by the feedback path 21, for regulating the pump current and to provide over-current protection.

Information about the flyback current is fed back to the current mode controller 15 by the feedback path 27 for current mode regulation of the flyback voltages by current mode pulse width modulation of the control signal Q.

The operating point and secondary output voltages of the flyback can be tailored to match any demand. Steady state operation above constant current mode boundary close to 50% duty cycle is preferred.

Figure 2:
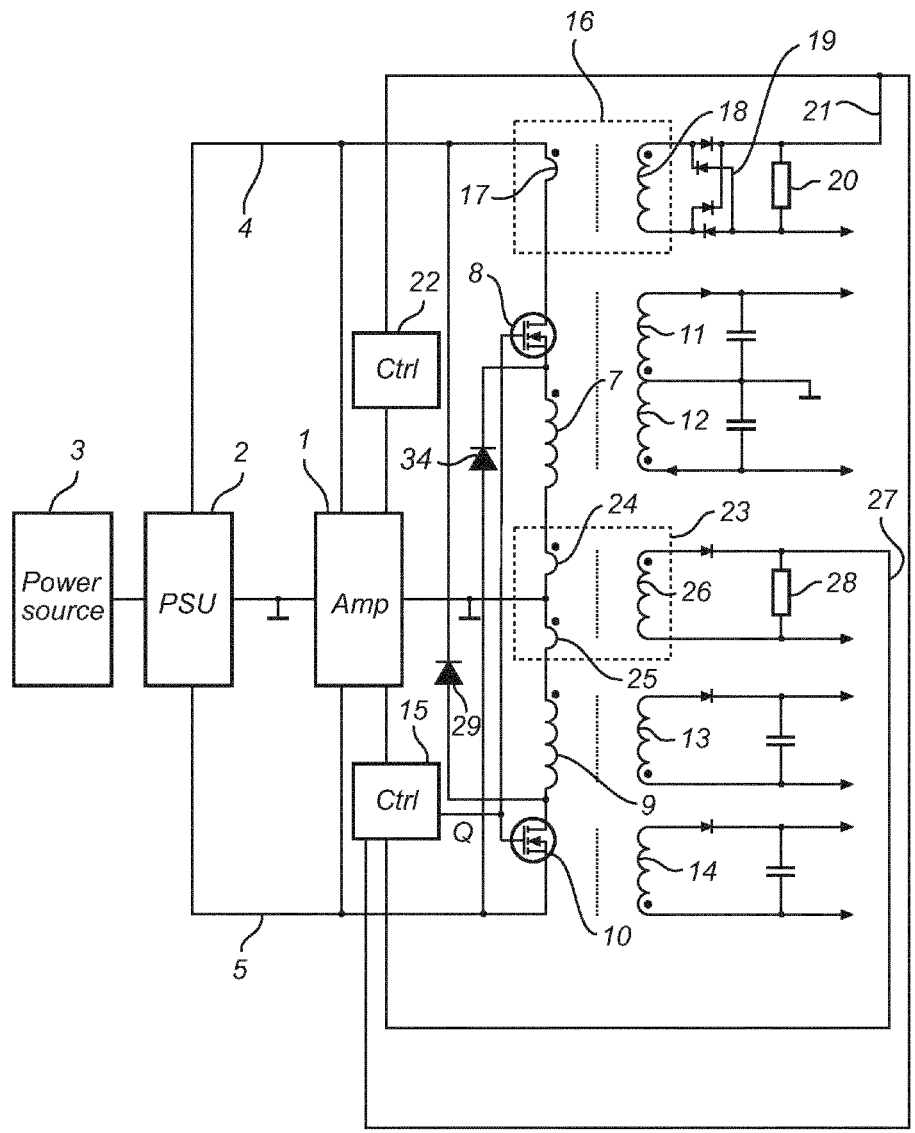
FIG. 2 shows a block schematic of an audio amplifier system implementing a power supply arrangement according to a further embodiment of the present invention.

According to a further embodiment of the invention, illustrated in FIG. 2, the transformer arrangement comprises two additional clamp diodes 34 and 29. The first diode 34 is connected with its anode to negative rail 5, and its cathode to the source node of the switch 8. The second diode 29 is connected with its anode to the drain node of the switch 10 and its cathode connected to the positive rail 4. Any energy stored in the leakage inductance of the primary windings 7 during the forward cycle will be returned to the negative rail 5 through the first clamp diode 34 during the flyback cycle. Any energy stored in the leakage inductance of the primary windings 9 during the forward cycle will be returned to the positive rail 4 through the second clamp diode 29 during the flyback cycle.

Since the rail voltage levels in most applications are regulated and the amplifier flyback load is almost constant, the control signal Q controlling the switches 8, 10 preferably has a duty cycle close to 50%, which is optimum with respect to the regulation of rail imbalance due to pump cancelling.

Figure 3:
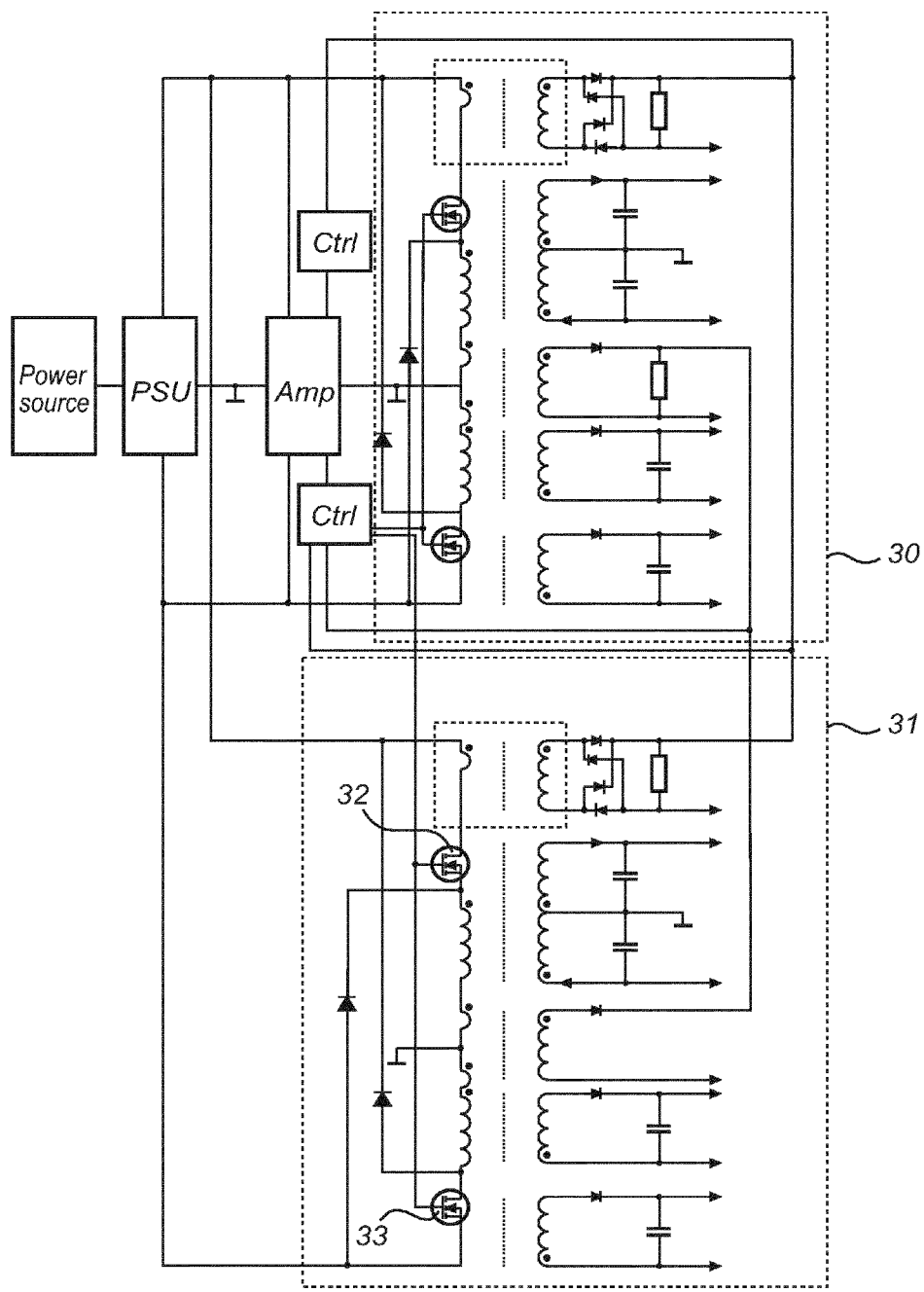
FIG. 3 shows a block schematic of an audio amplifier system implementing a power supply arrangement according to a yet another embodiment of the present invention.

However, in order to even further improve the pump cancelling performance an interleaved design as illustrated in FIG. 3 may be implemented.

In this embodiment, the transformer arrangement comprises an additional set of transformer windings and switches 31, in addition to the set 30 described above. The additional switches 32, 33 are controlled by a control signal $Q_{not}$, which is phase shifted 180 degrees with respect to Q. In other words, when Q is ON, $Q_{neg}$ is OFF, and vice versa. The interleaving will enable the forward pump canceller duty cycle to be close to 100% hence obtaining almost continuous pump cancelling.

Interleaving the fly back outputs will partly cancel the ripple current on flyback outputs, 11, 12, 13 & 14 since the ripple frequency will be twice the non interleaved frequency.

The person skilled in the art realizes that the present invention by no means is limited to the preferred embodiments described above. On the contrary, many modifications and variations are possible within the scope of the appended claims. For example, other types of switches may be used, and the details in the circuitry may deviate from the illustrated examples.

The invention claimed is:

1. A power supply arrangement comprising power supply unit with a positive supply rail and a negative supply rail for supplying a single ended class D amplifier, and a transformer arrangement connected between the positive and negative power rails, said transformer arrangement including:
    a first primary winding connected in series with a first switch between the positive supply rail and ground,
    a second primary winding in phase with said first primary winding and connected in series with a second switch between the negative supply rail and ground, and
    a controller adapted to apply a control signal to said first and second switches, said control signal (Q) having ON-pulses of a predefined pulse time separated by a dead time, so that, when said first and second switches are closed (ON), said first winding will experience a first potential difference and said second winding will experience a second potential difference,
    wherein, if said first potential difference is greater than said second potential difference, said second switch will act as a rectifier, and energy will be transformed from said first winding to said second winding, and
    wherein, if said second potential difference is greater than said first potential difference, said first switch will act as a rectifier, and energy will be transformed from said second winding to said first winding, so that energy will be transferred continuously cycle by cycle, thereby reducing supply pumping.

2. The power supply arrangement according to claim 1, wherein said first and second primary winding each has the same number of turns.

3. The power supply arrangement according to claim 1, further comprising a pump current control arrangement, including:
    a pump current control arrangement having a pump current control primary winding connected in series with said first primary winding, and a pump current control secondary winding for monitoring a magnitude of a pump current through the pump current control primary winding, and
    a feedback path for feeding pump current information from said secondary winding back to the pump controller to enable pump current regulation.

4. The power supply arrangement according to claim 1, wherein said transformer arrangement further comprises an air-gap and at least one secondary winding, 180 degrees phase shifted from said first and second primary windings, for supplying at least one secondary voltage.

5. The power supply arrangement according to claim 4, wherein said secondary voltage is regulated by current mode pulse width modulation of said control signal (Q).

6. The power supply arrangement according to claim 5, further comprising a flyback control arrangement, including:
- a flyback control transformer having a first flyback control primary winding connected in series with said first primary winding, a second flyback control primary winding connected in series with said second primary winding and in phase with said first flyback control primary winding, and a flyback control secondary winding coupled in phase with said first and second flyback control primary windings, for monitoring a magnitude of a flyback current through the flyback control primary winding, and
- a feedback path for feeding flyback current information from said flyback control secondary winding back to said controller for regulating any flyback secondary voltages by current mode pulse width modulation of the control signal (Q).

7. The power supply arrangement according to claim 6, wherein said flyback control primary windings are arranged in such a manner that the contributions from pump currents through the flyback control primary windings cancel each other, ensuring that only said flyback current will be detected by the winding and supplied to the current mode controller.

8. The power supply arrangement according to claim 1, wherein said first and second switch are controlled by said controller to switch between a forward cycle, during which said first and second switch are both closed (ON), and a flyback cycle, during which said first and second switch are both open (OFF).

9. A power supply according to claim 1, wherein said transformer arrangement has a single magnetic core.

10. A power supply system according claim 1, further comprising a first clamp diode connected between a source node of the first switch and the negative power supply rail, so that any energy stored in leakage inductance of the primary winding is returned to the negative rail through the clamp diode.

11. A power supply system according to claim 1, further comprising a second clamp diode connected between a drain node of the second switch and the positive power supply rail, so that any energy stored in leakage inductance of the primary winding is returned to the positive rail through the clamp diode.

12. A power supply system according to claim 1, further comprising a second transformer arrangement interleaved with the first transformer arrangement, wherein said switches of said second transformer arrangement are controlled by a second control signal ($Q_{neg}$) which is 180 degrees phase shifted from the first control signal (Q).

* * * * *